United States Patent [19]

Johnston et al.

[11] Patent Number: 5,065,351

[45] Date of Patent: Nov. 12, 1991

[54] STABILIZATION AND CALIBRATION OF PRECISION ELECTRONIC CIRCUIT COMPONENT

[75] Inventors: Everett A. Johnston, Westford; Robert Poe, Charlestown, both of Mass.

[73] Assignee: Eastman Kodak Company, Rochester, N.Y.

[21] Appl. No.: 331,261

[22] Filed: Mar. 30, 1989

[51] Int. Cl.$^5$ ............... G06F 15/20; G01D 18/00
[52] U.S. Cl. ............... 364/571.04; 358/10; 364/553; 364/570
[58] Field of Search ............ 364/570, 571.01-571.08, 364/553; 341/118, 120, 121, 140; 358/222, 406, 474, 475, 10; 307/264, 492; 330/9, 85, 86; 250/253

[56] References Cited

U.S. PATENT DOCUMENTS

| | | | |
|---|---|---|---|
| 3,579,127 | 5/1971 | Thomas | 307/492 |
| 3,600,589 | 8/1971 | Hanson . | |
| 3,634,868 | 1/1972 | Pelavin et al. | 364/571.05 |
| 3,736,520 | 5/1973 | Acker . | |
| 4,025,788 | 5/1977 | Arima et al. | 250/253 |
| 4,070,632 | 1/1978 | Tuttle | 330/86 |
| 4,123,722 | 10/1978 | Cubbison, Jr. | 330/85 |
| 4,140,874 | 2/1979 | Thomas | 364/571.03 |
| 4,162,531 | 7/1979 | Rode et al. | 364/571.04 |
| 4,178,512 | 12/1979 | Frungel et al. | 250/253 |
| 4,218,662 | 8/1980 | Schroder | 307/264 |
| 4,268,795 | 5/1981 | Zolotenko et al. | 330/9 |
| 4,268,851 | 5/1981 | Heller et al. | 358/10 |
| 4,300,203 | 11/1981 | Brown | 364/570 |
| 4,327,371 | 4/1982 | Edson et al. | 358/10 |
| 4,328,552 | 5/1982 | Stovall | 364/553 |
| 4,335,384 | 6/1982 | Roos | 330/2 |
| 4,357,668 | 11/1982 | Schwartz et al. | 364/571.04 |
| 4,364,027 | 12/1982 | Murooka | 364/571.05 |
| 4,395,752 | 7/1983 | Hirosawa | 364/553 |
| 4,538,150 | 8/1985 | Bone, Jr. | 342/174 |
| 4,612,533 | 9/1986 | Evans | 364/571.05 |
| 4,634,986 | 1/1987 | Brookshier | 307/492 |
| 4,635,096 | 1/1987 | Morgan | 358/10 |
| 4,636,655 | 1/1987 | Nagano | 307/261 |
| 4,669,052 | 5/1987 | Bianco | 364/571.04 |
| 4,679,162 | 7/1987 | Ferber et al. | 364/570 |
| 4,700,174 | 10/1987 | Sutherland et al. | 364/571.02 |
| 4,704,584 | 11/1987 | Smither | 330/86 |
| 4,726,679 | 2/1988 | McCaffrey | 356/315 |
| 4,733,234 | 3/1988 | Sparks et al. | 364/571.02 |
| 4,746,970 | 5/1988 | Hosokawa et al. | 358/10 |
| 4,785,419 | 11/1988 | Huffman | 364/571.01 |

FOREIGN PATENT DOCUMENTS 0065339 5/1982 European Pat. Off. .
0118178 1/1984 European Pat. Off. .

OTHER PUBLICATIONS

Howard M. Berlin, *Operational Amplifiers*, 1977, Heath Company, 5-11 through 5-14.
Japanese Patent Abstract, Publication 55099031.

Primary Examiner—Kevin J. Teska
Attorney, Agent, or Firm—Cesari & McKenna

[57] ABSTRACT

A technique for stabilization and calibration of precision analog circuit components such as amplifiers. A sample and hold circuit is placed in the feedback loop of the component. The input of the component is periodically coupled to reference voltage while the sample and hold circuit is set to a sample mode. Any offset voltage at the output of the component is then fed, through the sample and hold circuit, back to a summing node formed at the input, and thus automatically canceled. This sequence is periodically repeated at convenient times, to keep the sample and hold circuit properly charged, and to compensate for changes in operating conditions over time.

The transfer function of the component can be determined by a circuit which periodically measures its response to a series of known input voltages. The exact value of the voltage input to the component is known, since any offset is automatically canceled by the operation of the sample and hold circuit. After the response of the component to a number of inputs is measured in this way, its transfer function is determined using a method such as LaGrangian interpolation. During normal operation of the component on the analog input signal, the computer then converts measured outputs to the interpolated values.

13 Claims, 3 Drawing Sheets

STABILIZATION AND CALIBRATION OF PRECISION ELECTRONIC CIRCUIT COMPONENT

FIELD OF THE INVENTION

This invention relates generally to electronic circuits and more specifically to calibration and stabilization of precision analog circuit components such as logarithmic amplifiers.

BACKGROUND

Precision analog electronic components such as logarithmic amplifiers (log amps) are used in a variety of applications. One such application is in optical scanners, which are devices that read incident light patterns to generate electrical signals that vary in accordance with the light patterns' brightness. Each electrical signal can then be converted into a series of digital bits which is readable by a computer. The Universal Product Code (UPC) scanner used in a supermarket checkout line is a simple type of scanner familiar to most people.

More sophisticated scanners can generate computer-readable representations of complex images, such as a document or photograph. A computer is then used to edit the image representation, combine it with other images or data such as text, and perform other operations such as image enhancement. With such a system, printing of the computer-readable image can be postponed until it is in the desired form. New applications for this process appear almost daily and it is only a matter of time before nearly every computer user will routinely use scanners in the preparation of reports, memoranda, and other business documents.

To create the computer-readable image representation, a scanner uses a light source and a photodetector. The light source is focused on a particular point, or pixel, of the image, and the amount of light reflected or transmitted by that pixel is then measured by the photodetector. The photodetector output is thus a voltage which represents the brightness of the pixel. The range of values over which this voltage can vary is known as the dynamic range of the photodetector's output voltage.

The analog voltage output by the photodetector is then quantized by an analog-to-digital (A/D) converter. The quantization process converts the voltage to a binary number, representing an integer, which is read by the computer. The light source is then focused on another pixel, and this process continues until the entire image is scanned.

The process of converting the analog voltage to an integer invariably involves a compromise. The greater the number of bits available to represent the integer, the greater the range of available unique integers. In turn, this means a better quality quantized image, since the number of available intensity levels will be greater. Similarly, if a color image is quantized, then the image quality will increase as the number of available discrete levels in each of the primary colors increases.

However, as the number of bits used to quantize the intensity of a pixel increases, so too does the cost of the equipment, principally because the amount of computer memory needed to store the image also increases.

As a result, a log amp is quite often used to compress the dynamic range of a video signal such as the photodetector output. The use of a log amp significantly reduces the number of bits required to achieve a particular image quality. For example, when a log amp is used, it is generally agreed that an eight bit A/D converter provides sufficient contrast to approximate the intensity range in a standard television image. Without the log amp, twelve bits are necessary to obtain the same image quality.

A log amp is also used in this application because of the non-linear sensitivity of the human visual system, which varies approximately in inverse proportion to image brightness. A stage of logarithmic amplification, preceding A/D conversion, distributes the discrete intensity levels more efficiently with respect to visual sensitivity and permits a reduction in the number of bits without loss of perceived image quality.

However, introducing a log amp involves another compromise, since any small difference in the log amp's input voltage is transferred to its output, amplified by a factor which depends on the input voltage. This is due to the fact that the gain of a log amp varies as a non-linear, logarithmic function of the input voltage. This problem is particularly noticeable for small input voltages, since the slope of the logarithmic gain curve is particularly steep at the low end of the input voltage range.

Thus, any undesired offset voltage appearing at the input of the log amp, such as that caused by noise, component tolerances, design inaccuracies, drift with temperature or supply voltage, and the like, will have a nonlinear effect on the log amp's output. In fact, any such undesired offset will be magnified if the actual input voltage is low. Careful stabilization of the log amp and very restrictive temperature control are often required to minimize the effect of any such offset voltage.

One prior approach compensates for this effect in a log amp by arranging a potentiometer to null out any offset voltage. See Berlin, Howard, M., Operational Amplifiers, (1979: Heath Company, Benton Harbor, Michigan), pp. 5-11 through 5-14. However, this approach requires a skilled technician to periodically calibrate the potentiometer.

Another technique is to use matched transistor pairs, as in Sheingold, Daniel, ed., Nonlinear Circuits Handbook, (1976: Analog Devices, Inc., Norwood, Massachusetts) pp. 179-188. However, matched transistor pairs are expensive, and even if the expense is justified, semiconductor devices exhibit only limited operational stability over the course of time. This is due at least in part to internally occurring silicon diffusion processes.

The first approach requires repeated human intervention to readjust the potentiometer, while the second approach provides limited temperature compensation. But even when they are used with a quality amplifier, neither is perfect over the long term nor over wide temperature spans. Thus, with either or both of these approaches, null-point instability occurs nonetheless. A lack of null-point stability, particularly in applications where sensitivity is of utmost importance, cannot be tolerated. Because the human eye is quite perceptive to slight variations in brightness levels, particularly at low light levels, image digitization is one such application where the operation of the log amp must be stable. Any instability is even more intolerable in a color image scanner. Such a scanner typically has three photodetector outputs for each pixel, one for each of the red, green, and blue primary colors. Since the three photodetector outputs are eventually recombined to form the digitized image, any offset in one of the channels results in an undesirable hue imbalance.

What is needed is a way to stabilize the output of a log amp so that it is fairly impervious to offset voltages or other drifts in operation over time. This would allow the quantization process to be repeatable from image to image and identical across multiple output channels.

Yet another problem with precision circuit components such as log amps, is due to the fact that the entire system's accuracy depends upon how accurate the log amp is. Some prior systems have thus provided for calibration of the log amp, such as in U.S. Pat. No. 4,335,384 issued June 15, 1982 to Roos. In that system, an exponentially decaying analog signal is used to calibrate the log amp. With this approach, the delay time of the log amp response must be estimated in advance.

In fact, accurate estimation of the log amp's response in advance is quite difficult, especially at the low range of input voltages. Because the bandwidth of the log amp is quite low in this range, and varies as the input voltage increases, the signal propagation delay through the log amp also changes in accordance with the input level.

In many applications it is necessary to characterize the transfer function of a non-linear circuit component accurately in spite of this difficulty. In particular, the response of a "log amp" is only approximately logarithmic and deviates significantly from logarithmic behavior, particularly at the low end of the input voltage range. Furthermore, the transfer function is likely to change over the course of time, as a result of temperature fluctuations, etc. Therefore, a means of calibration may be required, not only for the use of trained technicians during installation or maintenance procedures, but for automatic use during normal system operation. It must, therefore, be relatively fast, accurate, efficient, and reliable. Given this capability, it would then be possible to calculate the input voltage reliably and accurately, by applying the inverse of the measured transfer function to the observed output of the log amp.

SUMMARY OF THE INVENTION

Briefly, an apparatus constructed in accordance with the invention includes a precision analog circuit component, such as a log amp, connected to receive on an analog input signal. A sample and hold circuit is placed in a feedback loop of the log amp; the input of the log amp is periodically coupled to a reference signal, preferably zero volts, while the sample and hold circuit is set to a sample mode. Any offset voltage at the output of the log amp is then coupled, through the sample and hold circuit, as negative feedback to a summing node formed at the input of the log amp. This directs the log amp output towards zero, automatically canceling any offset voltage. After a sufficient settling time, the sample and hold circuit is then placed in the hold mode, thus holding whatever bias was required at the summing junction to drive the log amp to zero output. The log amp can then resume its intended normal operation; that is, logarithmic amplification of the analog input signal.

This sequence is periodically repeated at convenient times to maintain the proper offset voltage, thereby compensating for changes in operating conditions. For example, when using the circuit in an image scanner, the log amp can be re-stabilized after every line of the image is scanned.

Furthermore, the transfer function of the log amp can be determined by a circuit which periodically measures its response to a series of known input voltages. This circuit includes a digital-to-analog (D/A) converter and a selectable gain amplifier which apply a known voltage to the summing node at the log amp input. The use of a selectable gain amplifier significantly increases the dynamic range and accuracy of these input levels. Data words from a memory, such as a readonly memory (ROM), provide the input to the D/A converter. Another data bit from the memory controls the selectable gain amplifier. An appropriate circuit such as a counter provides the address output to the memory.

Periodically, the computer initiates a calibration sequence by causing the counter to count, which in turn sends a sequence of addresses to the memory, which in turn causes the D/A converter and amplifier to present a series of analog voltages to the log amp. The exact values of these voltages are known, since any offsets are automatically canceled by the operation of the sample and hold circuit. The A/D converter output is then stored in a second memory, which acts as a buffer, until it can be read by the computer.

After the response of the log amp to a number of known inputs is measured in this way, the computer determines the inverse of the log amp's transfer function from the measured points using a method such as Lagrangian interpolation. During normal operation of the log amp on the analog input signal, the computer then converts measured log amp outputs to the corresponding inputs by using the interpolated values.

This arrangement has several advantages. The log amp is stabilized by eliminating any offset voltage automatically. Its output is thus more predictable over time, and there is no need for a skilled technician to perform a recalibration sequence manually. In applications such as color image scanners, it can be used to maintain a stable relationship among the outputs from different log amps associated with red, green, and blue channels, thus avoiding hue imbalances.

Other advantages ensue from the circuit used to characterize the log amp's transfer function. Recalibration can be accomplished automatically and rapidly, without human intervention. The use of a memory-based sequence of input calibration values permits greater flexibility in constructing complex test patterns, which can be adjusted as desired to facilitate the measurement of the transfer function or other properties of the log amp (or other non-linear component). The use of an address counter establishes a strict correspondence between the known input voltages presented to the log amp and the observed outputs from the A/D converter, thus avoiding the problem of unknown, variable time delays through the circuit. The resulting calibration procedure is more efficient, reliable, and convenient than prior techniques.

BRIEF DESCRIPTION OF THE DRAWINGS

The above and further advantages of the invention may be better understood by referring to the following description in conjunction with the accompanying drawings, in which.

DETAILED DESCRIPTION OF AN ILLUSTRATIVE EMBODIMENT

As previously explained, one aspect of the invention is to stabilize a precision analog circuit component, such as a logarithmic amplifier (log amp), by placing a sample and hold circuit in its feedback loop. Normal operation of the log amp is periodically interrupted while the sample and hold circuit is placed in the sample mode. A known reference voltage is then forced at the input of the log amp. Any offset signal at the output of the log amp is thus fed, through the sample and hold circuit, to a summing node formed at the input of the log amp in such phase as to drive the log amp output toward zero. This automatically cancels the offset voltage. After a sufficient settling time, the sample and hold circuit is placed in the hold mode, and the log amp is allowed to resume normal operation.

Figure 1:
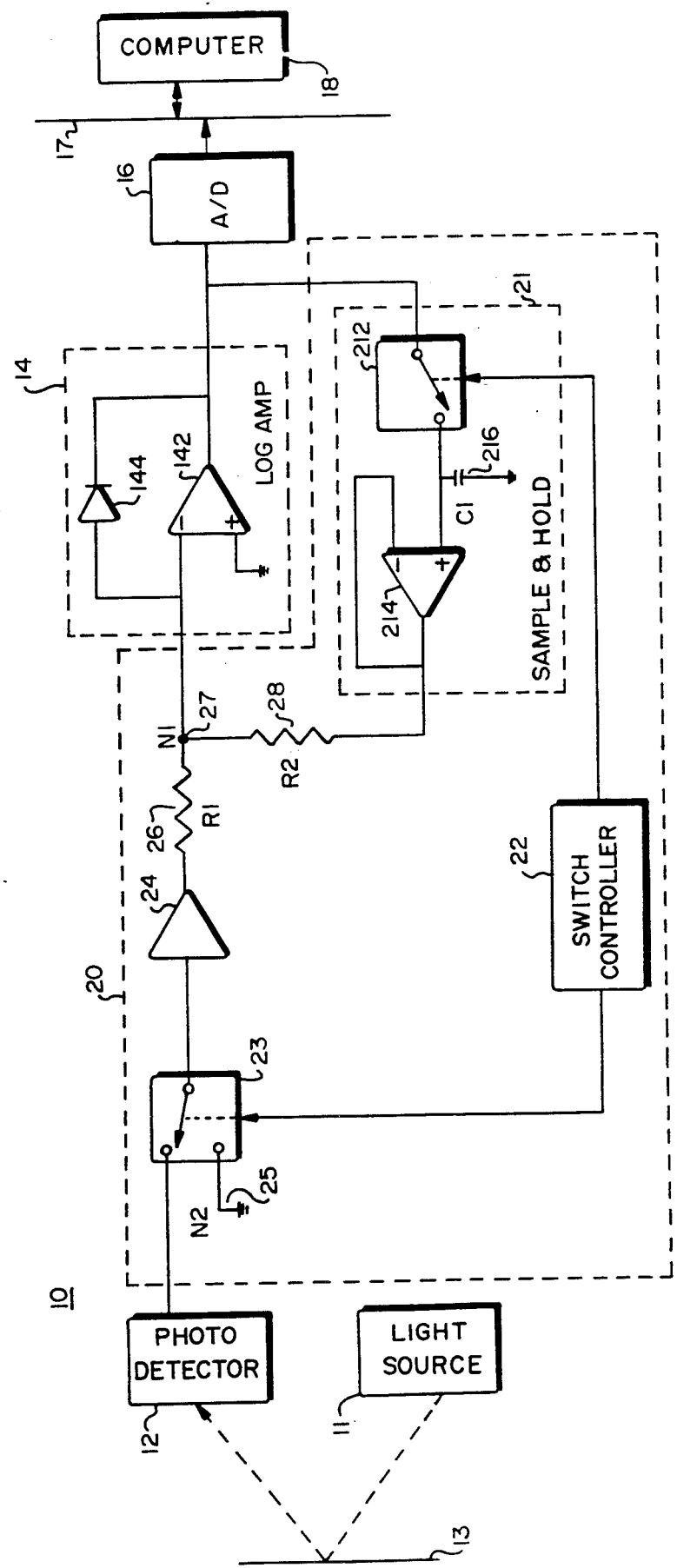
FIG. 1 is a block diagram of the invention, showing the logarithmic amplifier and stabilization circuit.

To appreciate this further, consider FIG. 1, where there is shown an image digitizer, or scanner 10, which makes use of the invention. As is conventional, scanner 10 includes a light source 11, a photodetector 12, a log amp 14, and an analog to digital (A/D) converter 16. In operation, the light source 11 is focused on a particular picture element, or pixel, of an image source 13, and the amount of light incident at that pixel is measured by photodetector 12. The photodetector 12 produces an analog voltage indicative of the light intensity level.

This analog voltage is then passed to the log amp 14 for dynamic range compression, and then finally to the A/D converter 16. The A/D converter 16 provides as output an M-bit binary number which represents the relative light intensity of the pixel. The M-bit binary number is then passed to a computer 18 over an interface 17, the interface 17 advantageously comprising an input/output bus for the computer 18. Additional points of the image are then scanned by focusing the light source 11 on a different pixel, either by changing the point of incidence of the light source 11 and photodetector 12, or by moving the image 13. In this fashion, the computer 18 can assemble an entire image from the series of scanned pixels.

However, unlike prior systems, scanner 10 also includes a stabilization circuit 20 which stabilizes the operation of the log amp 14 by canceling any parasitic offset voltage appearing at its input. Stabilization circuit 20 includes a sample and hold circuit 21, a switch controller 22, a switch 23, a buffer amplifier 24, and resistor R1, indicated at 26, and resistor R2, indicated at 28. The input of sample and hold circuit 21 is connected to the output of the log amp 14. The output of sample and hold 21 is connected to a node N1, indicated at 27, which serves as the inverting input terminal of the log amp 14, as well as a summing junction for the outputs of amplifiers 24 and 214.

The following discussion of the details of stabilization circuit 20 begins with a description of its preferred construction and arrangement. A discussion of how stabilization circuit 20 operates to achieve the desired effect then follows.

By way of example, the log amp 14 is shown as a fundamental log amp model including an inverting operational amplifier (op amp) having a diode 144 arranged in its feedback path to provide a logarithmic gain characteristic. Diode 144 thus has its anode connected to the log amp input terminal at node N1, and its cathode connected to the output terminal of the op amp 142. Other circuits which provide logarithmic gain can be used in the place of the illustrated log amp 14.

Also by way of example, the sample and hold circuit 21 is shown as including a switch 212, a capacitor C1 indicated at 216, and another op amp 214. Switch 212 receives the output of the log amp 14, and, if the switch 212 is closed, passes the log amp output to charge the capacitor C1. The state of switch 212 is controlled by switch controller 22. Op amp 214 acts as a buffer to isolate the capacitor C1 from discharge through node N1.

Thus, when switch 212 is closed, sample and hold circuit 21 is said to be in a sample mode, since the voltage across capacitor C1 and hence at the output of op amp 214 will essentially equal the voltage input to the switch 212. When switch 212 is opened, the voltage across capacitor C1 will no longer track the level of the voltage at the input to switch 212, and thus the output of sample and hold 21 will remain fairly constant. Its output will, of course, decay at the discharge rate of capacitor C1 through any available parasitic resistance.

Switch 23 and buffer amplifier 24 are arranged in the signal path between the photodetector 12 and log amp 14. Under command from the switch controller 22, switch 23 passes to amplifier 24, either the output of the photodetector 12, or a reference signal such as that provided by a ground node N2 indicated at 25. The buffer amplifier then presents the output of the switch 23 to node N1 through resistor R1.

Now proceeding with discussion of the operation of these components, it will be understood how stabilization circuit 20 compensates for any offset voltage appearing at the output of log amp 14. First, the switch controller 22 periodically sets switch 23 to connect the ground reference signal at node N2 to the buffer amplifier 24 and thus to node N1. After time sufficient for any transients to settle, switch controller 22 then sets sample and hold circuit 21 to the sample mode by closing switch 212.

In this arrangement, with nominally zero volts fed into the log amp 14, any voltage appearing at the output of log amp 14 is due to an unwanted offset voltage appearing at the input. However, this unwanted offset voltage will also appear, at the output of sample and hold circuit 21, and with such a polarity as to subtract from node N1. Thus, the log amp 14 and sample and hold 21 will, after a suitable settling time, reach a point where the output of the log amp 14 is truly zero volts, any offset voltage being thereby being effectively nulled.

Once the stabilization process is complete, normal operation of the log amp 14 on the signal from the photodetector 12 can resume. However, switch controller 22 must first open switch 212 to hold the proper null condition at node N1. Then, switch 23 is set to allow the output of photodetector 12 to again be processed by the log amp 14 and the A/D converter 16.

In the particular scanner device application shown in FIG. 1, it has been found convenient to operate the stabilization circuit 20 approximately once for every line of pixels scanned in the image 13, while the optical components are synchronized. This interval between calibration sequences is sufficiently less than the time for capacitor C1 to discharge appreciably and sufficiently short enough so as to avoid interfering with the normal operation of scanner 10. Because stabilization occurs dynamically, the effect of any drift in the operation of the log amp 14 over time, with temperature, and the like is also virtually eliminated.

While the circuit shown in FIG. 1 adequately nulls any offset voltage observed when the input of log amp 14 is a single reference signal, such as zero volts, it is sometimes desirable to determine the operation of log amp 14 over a range of possible input voltages, and thus its transfer function. Generally speaking, this can be accomplished by the embodiment shown in FIG. 2, which periodically characterizes the transfer function, and in particular the gain, of the log amp 14 at a number of points within the range of allowable input voltages. The result of this characterization is the generation of look-up table relating each possible A/D output with an interpolated log amp input value.

A log amp is more sensitive to perturbation at, voltage levels, since its gain varies inversely as the input voltage. Thus, with the present invention, measurement of the transfer function is carried out with more precision within the low range of input values. This is done by forcing a series of input voltages having an anti-logarithmic progression.

More particularly now, characterization is accomplished by periodically using a digital-to-analog (D/A) converter 32 to apply a known input voltage to the log amp input node N1. The voltage at node N1 is further controlled by a selectable-gain amplifier 34. A memory 31 such as a read-only memory (ROM) provides the input to the D/A converter 32 and selects the gain of the selectable amplifier 34. The response of the log amp 14 to this known voltage input is then determined by having the computer read the output of the A/D converter 16. A number of data are measured this way.

Once this measurement process is complete, the computer 18 further processes the calibration input and output data as follows. In particular, a calibration look-up table relating any possible M-bit output from the A/D converter 16 to a corresponding input voltage is prepared. This is accomplished by first averaging calibration output data words which were generated in response to identical calibration input data words, to determine the most likely M-bit calibration output word for each possible calibration input word. The result of this averaging process is an initial coarse table of values defining the gain characteristic of the log amp 14. This coarse table of values, which typically has less than 2M entries, which constitutes the inverse of the log amp's transverse function. The method is to interpolate the data in the coarse table, by relating the averaged calibration output data words to the logarithms of the corresponding calibration input data words. Various numerical techniques, such as Lagragian interpolation or least-squares regression, can be used for this purpose. The interpolated function is then evaluated to generate interpolated values for each of the 2M possible output values from the A/D converter 16.

Finally, a calibration look-up table is generated by calculating the anti-logarithms of each interpolated value to arrive at a calibrated input value.

Thus the calibration process operates by taking the logarithm of the known calibration input values, interpolating within these logarithmic values, and then taking the antilogarithm of the interpolated quantities. In this fashion, each of the possible 2M output values from the A/D converter 16 is thus related to a calibrated input voltage by simply using this output value directly, the computer uses it as an index for the calibration look-up table to more accurately determine what the actual voltage from photodetector 12 was.

Figure 2:
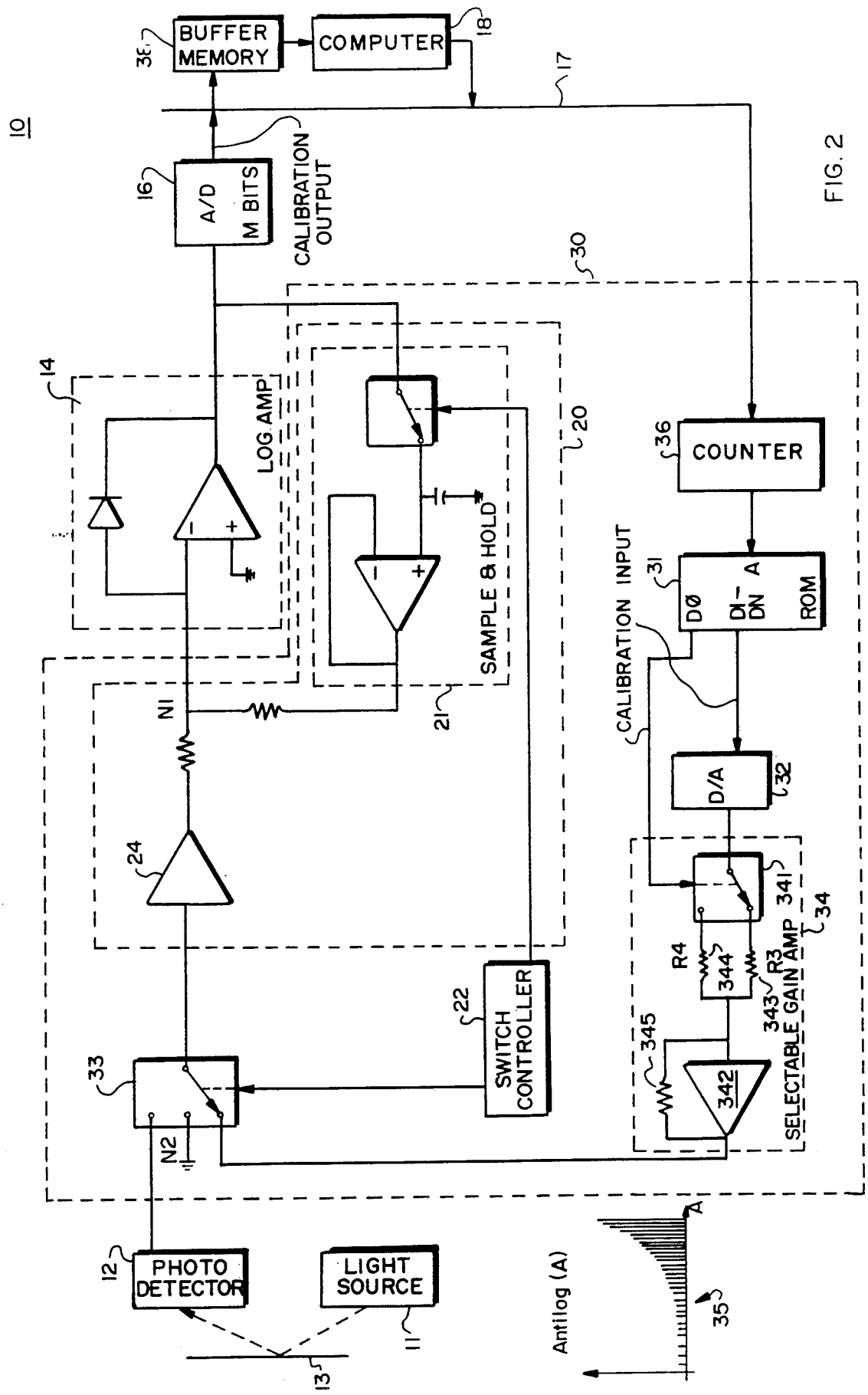
FIG. 2 is a block diagram showing a further embodiment of the log amp, with stabilization circuit and calibration circuit.

As with the embodiment of FIG. 1, the scanner 10 of FIG. 2 includes a light source 11, photodetector 12, log amp 14, A/D converter 16, and stabilization circuit 20. However, this scanner 10 also includes a calibration circuit 30 which performs the transfer function characterization just described. Calibration circuit 30 consists of a counter 36, a memory 31, a digital to analog (D/A) converter 32, a three-position switch 33, a selectable gain amplifier 34, and another memory 38. As will be seen, certain of the calibration operations are also performed by the computer 18.

The memory 31 is programmed with a number of data words representing desired test input voltages. A certain portion of each data word is presented to D/A converter 32. Other portions of the data words control the operation of the selectable amp 34.

As depicted by the curve 35, the data words are preferably ordered so as to increase in value as the address input of memory 31 is incremented. The increase in value is preferably exponential (that is, anti-logarithmic), so that more test values appear in the low range. Thus, for example, the words initially read out of the memory 31 preferably differ by a value of one; later words differ by larger amounts. In this fashion, more samples of the log amp's transfer function are taken in the range of lowest input voltages, which is the region most susceptible to perturbation. Each value is also preferably repeated a number of times to guarantee sufficient statistical precision in the ensuing calibration process, as will be described.

In the illustrated embodiment, memory 31 is a pre-programmed read-only memory (ROM), but memory 31 can also be programmed by having computer 18 write the proper data words sequence into a random access memory (RAM) 31 at a convenient time, before the characterization process begins.

In addition, although the address input A is shown as originating from the counter 36, which counts in sequence when strobed by the computer 18 to initiate calibration, other addressing arrangements are possible.

Data bits $D_1$-$D_N$ from the memory 31 are fed to the input of D/A converter 32. The number of bits, N, in the data words used to drive the D/A converter should be greater than the word size of the A/D converter 16, to enable more accurate characterization of the log amp 14 at low input voltages.

The output of D/A converter 32, an analog voltage, is in turn fed to the selectable-gain amplifier 34.

The selectable gain amp 34 operates on the output of the D/A converter 32 to precisely control the amplitude of the calibration voltage summed at node N1. Selectable gain amp 34 includes a switch 341, an op amp 342, and summing resistors R3 at 343, R4 at 344, and R5 at 345. The switch 341 and summing resistors R3, R4, and R5 are arranged so that op amp 342 provides unity gain when switch 341 is in one position, and a much lower gain, such as 0.1, when the switch 341 is in the other position. The setting of switch 341 is controlled by one of the bits, $D_0$, output from the memory 31. More ranges can be provided by adding control bits and summing resistors, and other gains can be selected, depending on the application of calibration circuit 30.

A three-position switch 33 is used to selectively provide, to node N1, either the reference signal from node N2, the output of the photodetector 12, or the calibration input from selectable amp 34. Switch controller 22 determines how three-position switch 33 is set at any particular point in time.

The buffer memory 38 serves as a vehicle to store, in real time, the responses of the A/D converter 16 to the series of input calibration voltage presented to the log amp 14.

Thus the selectable gain amp 34, the D/A converter 32, the memory 31, the A/D converter 16, and the memory 38 provide, in combination, a way to present a series of test voltages to the log amp 14 which are distributed exponentially across the range of possible log amp input values, and such that a series of test voltages are concentrated in the low end of the range. In the embodiment being described, at least one-half of the test voltages will be exponentially distributed in the lowest 10 percent of the input voltage range, which is the most sensitive part. The remaining values are exponentially distributed over the upper 90 percent of the input voltage range.

Now considering the operation of calibration circuit 30 and log amp 14 more rigorously, the calibration process first proceeds much as was previously described for FIG. 1. Thus, in order to null any offset voltage appearing at the input to photodetector 12, the three-position switch 33 is periodically set to the center position, so that the reference voltage at node N2 is passed to the node N1. In this mode, the components of stabilization circuit 20, including the sample and hold 21, are then operated as before to null any offset present at node N1, as was described in connection with FIG. 2.

The calibration circuit 30 is then periodically operated as follows. Switch controller 22 retains sample and hold 21 in hold mode, while positioning three-position switch 33 so that the output of D/A converter 32 will be fed to the input via the selectable gain amp 34.

Figure 3:
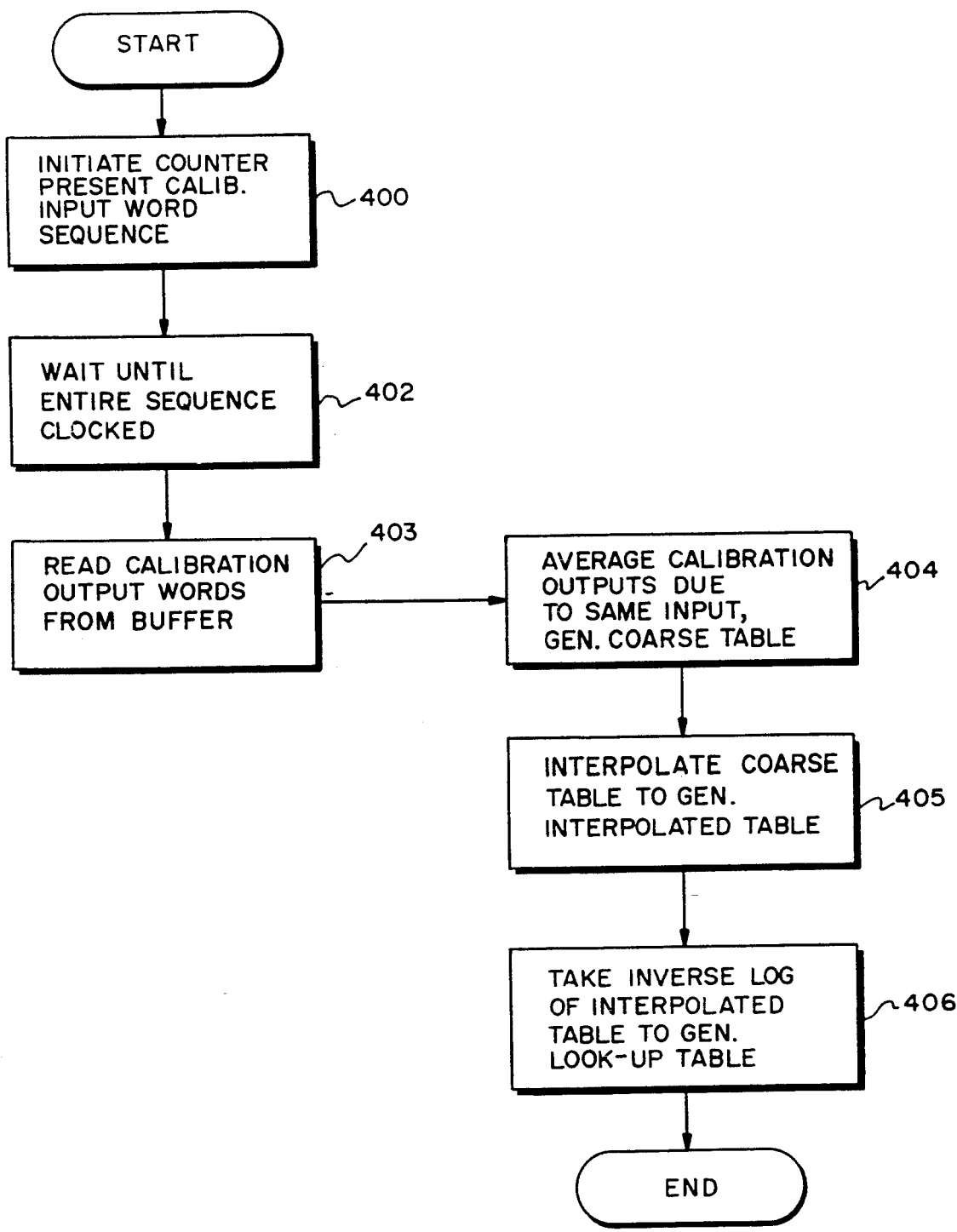
FIG. 3 is a flow chart of the operations performed by a computer on the data collected by the calibration circuit to generate an interpolation look-up table.

Now referring to the steps shown in the flowchart of FIG. 3 together with the circuit in FIG. 2, the computer 18 causes the calibration input words to be presented to the log amp 14 by initiating the counter 36, as shown in step 400.

In step 402, after allowing for an appropriate propagation delay, the responses of the log amp 14 to the voltage forced at node N1 are read by the A/D converter and stored as M-bit digital calibration output words in the memory 38 The computer 18 then reads and stores the M-bit word as indicated by step 403.

Once this measurement process is complete, the computer 18 further processes the calibration input and output data as follows. In particular, a calibration look-up table relating any possible M-bit output from the A/D converter 16 to a corresponding input voltage is prepared. This is accomplished by first averaging calibration output data words which were generated in response to identical calibration input data words, to determine the most likely M-bit calibration output word for each possible calibration input word. The result of this averaging process, as shown in step 404, is an initial coarse table of values defining the gain characteristic of log amp 14.

This coarse table of values, which typically has less than $2^M$ entries, is used to generate a look-up table, having precisely $2^M$ entries, which constitutes the inverse of the log amp's transfer function. The method is to interpolate the data in the coarse table, by relating the averaged calibration output data words to the logarithms of the corresponding calibration input data words. Various numerical techniques, such as Lagrangian interpolation or least-squares regression, can be used for this purpose. The interpolated function is then evaluated to generate interpolated input values for each of the $2^M$ possible output values from the A/D converter 16. See step 405.

Finally, in step 406, a calibration look-up table is generated by calculating the anti-logarithm of each interpolated value to arrive at a calibrated input value.

Thus, the calibration process operates by taking the logarithm of the known calibration input values, interpolating within these logarithmic values, and then taking the anti-logarithm of the interpolated quantities. In this fashion, each of the possible $2^M$ output values from the A/D converter 16 is thus related to a calibrated input voltage by simply using the look-up table. Thus, when data from the photodetector 12 is to be processed, the computer 18 reads the output of the A/D converter 16 as before. However, rather than using this output directly, the computer uses it as an index for the calibration look-up table to more accurately determine what the actual voltage from photodetector 12 was.

The foregoing description has been limited to a specific embodiment of this invention. It will be apparent, however, that variations and modifications may be made to the invention, with the attainment of some or all of the advantages of the invention.

For example, although the stabilization circuit 20 and calibration circuit 30 have been presented in the context of a scanner 10, other applications for logarithmic amplifiers quite clearly can make use of the invention. The invention can also be quite useful in stabilizing and calibrating other types of precision analog circuit components, whether they are linear or nonlinear, and whether or not they are log amps. And, while the illustrated embodiment emphasized calibration of the component's gain curve, the invention can also be used where calibration of component bandwidth, time delay, and other characteristics is important. Therefore, it is the object of the appended claims to cover all such variations and modifications as come within the true spirit and scope of the invention.

What is claimed is:

1. An apparatus comprising:
  a precision analog circuit component, connected to receive an analog input signal via an input node and to provide a precision component output signal;
  means for periodically interrupting the analog input signal and connecting the input node to a reference signal;
  a sample-and-hold circuit, connected to receive the precision component output signal, and to provide a sample-and-hold output signal, with the sample-and-hold output signal connected to the input node; and
  means for placing the sample-and-hold circuit in a sample mode when the input node is coupled to the reference voltage, and otherwise placing the sample-and-hold circuit in a hold mode.

2. An apparatus as in claim 1, additionally comprising:
  means for generating the reference signal, the reference signal including a series of successive predetermined reference voltages;
  means for determining a transfer function of the precision component when the input mode is connected to receive the reference signal,
  by applying each predetermined reference voltage to the precision component, waiting a period of time equal to or greater than a propagation delay associated with the precision component, and then measuring a response voltage, to provide a plurality of measured response voltages.

3. Apparatus as in claim 2 wherein the means for generating the reference signal further comprises a selectable gain amplifier.

4. Apparatus as in claim 2 additionally comprising:
data processing means, connected to receive the plurality of measured response voltages,
for calibrating the voltage of the analog input signal when the input node is connected to receive the analog input signal,
by measuring an output voltage from the precision component, and
evaluating the transfer function of the precision component by interpolating the plurality of measured response voltages, thereby determining a calibrated input voltage associated with the measured output voltage.

5. Apparatus as in claim 4 wherein the data processing means additionally
generates a look-up table consisting of calibrated input voltages for each possible measured output voltage.

6. Apparatus as in claim 4 wherein the data processing means interpolates the measured response voltages by Lagragian interpolation.

7. An apparatus for quantizing an analog input signal comprising:
a logarithmic amplifier, connected to receive the analog input signal via an output node, and to provide an amplified output signal;
means for periodically interrupting the analog input signal and coupling the input node to a reference signal;
a sample-and-hold circuit, having an input connected to receive the amplified output signal, and having an output connected to the input node;
means for placing the sample-and-hold circuit in a sample mode when the input node is connected to receive the reference signal, and for otherwise placing the sample-and-hold circuit in a hold mode;
means for generating the reference signal, the reference signal including a series of predetermined reference voltages; and
means for determining a transfer function of the logarithmic amplifier when the input mode is connected to receive the reference signal.

8. An apparatus as in claim 7 wherein the means for periodically generating the reference signal comprises:
a digital-to-analog converter, connected to receive a digital-to-analog converter input signal;
a memory, having a sequence of values stored therein which comprise samples of an exponential function, and connected to provide the digital-to-analog converter input signal; and
means for addressing the memory such that the exponential function values are output to the digital-to-analog converter in a predetermined sequence.

9. Apparatus as in claim 7 wherein the means for determining a transfer function of the logarithmic amplifier additionally comprises:
means for connecting the input node to receive the reference signal, and for applying each predetermined reference voltage to the logarithmic amplifier, waiting a period of time equal to or greater than a propagation delay associated with the logarithmic amplifier, and then measuring a response voltage, thereby providing a plurality of measured response voltages.

10. Apparatus as in claim 9 additionally comprising:
data processing means, connected to receive the plurality of measured response voltages, for averaging measured response voltages corresponding to identical successive reference voltages.

11. Apparatus as in claim 9 additionally comprising:
data processing means, connected to receive the plurality of measured response voltages, for determining the transfer function of the logarithmic amplifier by interpolating the plurality of measured response voltages.

12. Apparatus as in claim 11 wherein the data processing means additionally determines a transfer function of the logarithmic amplifier by Lagrangian interpolation.

13. Apparatus as in claim 11 wherein the data processing means additionally generates a look-up table consisting of calibrated input voltages for each possible measured output voltage.

* * * * *